United States Patent
Yokozawa (10) Patent No.: US 7,791,659 B2
(45) Date of Patent: Sep. 7, 2010

(54) SOLID STATE IMAGING DEVICE AND METHOD FOR PRODUCING THE SAME

(75) Inventor: Kenji Yokozawa, Shiga (JP)

(73) Assignee: Panasonic Corporation, Osaka (JP)

( * ) Notice: Subject to any disclaimer, the term of this patent is extended or adjusted under 35 U.S.C. 154(b) by 1355 days.

(21) Appl. No.: 11/240,533

(22) Filed: Oct. 3, 2005

(65) Prior Publication Data

US 2006/0187381 A1    Aug. 24, 2006

(30) Foreign Application Priority Data

Feb. 23, 2005    (JP)    ............................. 2005-046811

(51) Int. Cl.
*H04N 3/14* (2006.01)
*H04N 9/07* (2006.01)

(52) U.S. Cl. .................. 348/273; 348/272; 348/274; 348/336

(58) Field of Classification Search .............. 348/266, 348/272, 273, 274, 275, 276, 277, 280, 290, 348/291, 294, 297, 298, 299, 300, 301, 302, 348/303, 304, 305, 306, 307, 308, 309, 310, 348/335, 336
See application file for complete search history.

(56) References Cited

U.S. PATENT DOCUMENTS

| 6,081,018 | A  | * | 6/2000 | Nakashiba et al. | ........... 257/435 |
| 6,587,147 | B1 | * | 7/2003 | Li | ............... 348/340 |
| 2004/0246351 | A1 | * | 12/2004 | Hiatt et al. | .................. 348/272 |
| 2006/0187381 | A1 | * | 8/2006 | Yokozawa | ................... 349/106 |

FOREIGN PATENT DOCUMENTS

JP    5-119211 A    5/1993

* cited by examiner

*Primary Examiner*—David L Ometz
*Assistant Examiner*—Peter Chon
(74) *Attorney, Agent, or Firm*—McDermott Will & Emery LLP (57) ABSTRACT

A solid state imaging device comprises a plurality of pixels arranged in a matrix, each of the pixels including: a substrate; a photoelectric conversion element for converting light to electric charges; and a color filter formed on the photoelectric conversion element for color separation. The color filter is a layered color filter including a dye-contained color filter layer and a pigment-dispersed color filter layer formed on the dye-contained color filter layer, the dye-contained color filter layer and the pigment-dispersed color filter layer having the same hue.

8 Claims, 6 Drawing Sheets

SOLID STATE IMAGING DEVICE AND METHOD FOR PRODUCING THE SAME

CROSS-REFERENCE TO RELATED APPLICATION

This application claims priority under 35 U.S.C. §119(a) on Japanese Patent Application No. 2005-046811 filed on Feb. 23, 2005, the entire contents of which are hereby incorporated by reference.

BACKGROUND OF THE INVENTION

1. Field of the Invention

The present invention relates to a solid state imaging device which has an on-chip color filter and a method for producing the same.

2. Description of the Prior Art

In recent years, single-plate color solid state imaging devices has been remarkably developed along with the advancement of color picture imaging. Typical examples of such devices include, for example, a solid state imaging device for digital still cameras, mainly including CCD (Charge Coupled Device)-type devices, and a solid state imaging device for mobile camera phones, mainly including CMOS (Complementary Metal Oxide Semiconductor)-type devices. Therefore, demands for downsizing and increase in the number of pixels on the solid state imaging device having an on-chip color filter have been increasing.

However, such demands on the solid state imaging device result in a reduction of the light receiving area (the area of a photodetection sensor) of a photoelectric conversion element, which constitutes a cause of the decrease in the photoelectric conversion characteristic (photosensitivity) which is a primary characteristic of the solid state imaging device. Further, a color filter layer formed on the photoelectric conversion element is also downsized. Thus, conventional techniques cannot follow such severe demands as to reduction in film thickness and miniaturization and dimensional accuracy of a color filter layer. Accordingly, the characteristics of the color imaging device are deteriorated due to the color filter layer, so that color mixture, uneven color, nonuniform tone of lines, black defects, etc., occur.

For example, the typical size of optics incorporated in the most popular digital still cameras is shifting from ⅓ inch to ¼ inch, while a digital still camera with ⅙-inch or smaller optics has been developed for future products. The typical number of pixels is shifting from 3 Mega (3,000,000) pixels to 5 Mega (5,000,000) pixels. Further, a digital still camera with 6 Mega (6,000,000) pixels has been developed for future products.

In such a solid state imaging device with a decreased light receiving area and an increased number of pixels, new techniques need to be established for preventing deterioration in photosensitivity, which is one of the principal characteristics of the solid state imaging device, and preventing color mixture between adjacent pixels, uneven color, nonuniform tone of lines, black defects, etc.

That is, if only the number of pixels is increased without decreasing the pixel size, the chip size is increased, and the size of the solid state imaging device increases. Therefore, the size reduction and the increase in the number of pixels cannot be simultaneously achieved without a decrease in pixel size. In general, when the pixel size is decreased, the size of the photoelectric conversion element, typified by a photodiode, is accordingly decreased. Thus, a decrease in photosensitivity cannot be avoided. In view of such, various countermeasures have been devised for improving the photosensitivity. Especially for a microlens formed on a pixel, various ideas have been proposed as to both structure and production method.

The reduction of the pixel size (miniaturization) causes not only deterioration in photosensitivity but also deteriorations in various color characteristics due to a color filter layer. That is, in general, the dimensional accuracy of the color filter layer deteriorates along with a decrease in pixel size, and therefore, the characteristics of the solid state imaging device are deteriorated so that color mixture between adjacent pixels, nonuniform tone of lines, variation in photosensitivity, uneven color, etc., occur.

Conventionally, the color filter layer is formed of a so-called "dye-type" material. The dye-type material is a photosensitive material prepared by mixing a water-soluble polymer, such as gelatin, casein, polyvinyl alcohol, or the like, and a photosensitive cross-linking agent, such as a chromate, a dichromate, or the like. The dye-type material is dyed with an acid dye, or the like. To form a color filter layer of a dye-type material, in the first step, application, exposition and development are performed using a photosensitive material to form a pattern. Then, the resultant structure is dyed with an acid dye, or the like, and then, an anti-dyeing layer is formed of an acrylic film, or the like, whereby a color filter layer is completed. Alternatively, instead of providing the anti-dyeing layer, an anti-dyeing treatment may be carried out using tannic acid, or the like, on a dyed photosensitive material film before the color filter layer is completed.

Presently, color filters formed of a so-called "pigment-dispersed" material are more popular than the dye-type color filters. The pigment-dispersed material is a material prepared by dispersing a pigment in a binder resin and adding a cross-linking agent thereto for providing photosensitivity. The pigment-dispersed material can be handled, i.e., applied, exposed, and developed, as is a commonly-used resist, or the like, to form a pattern thereof, whereby a color filter layer is completed. The color filter layer of such a pigment-dispersed material can be formed into a thinner layer as compared with a conventional material and is excellent in heat resistance, lightfastness and chemical resistance. Further, with such a material, the production process can be simplified.

Comparing a dye-type color filter layer and a pigment-dispersed color filter layer, the dye-type color filter layer has the following characteristics.

An advantage of the dye-type color filter layer is a variety of dyes available, and hence, a high selection flexibility toward the spectral characteristics. Further, since the dye itself is not in the form of particles, the frequency of occurrences of black defects is low when such a dye-type material is used for a color filter layer.

A disadvantage of the dye-type color filter layer is the necessity for a thicker film for the purpose of achieving desired spectral characteristics. Because of this, the definition is deteriorated, and this is disadvantageous in finer pattern formation. As for durability (heat resistance, lightfastness, chemical resistance, etc.), the dye-type material is inferior to the pigment-dispersed material. Further, dyeing and anti-dyeing steps are necessary. Therefore, a production process becomes longer, and there are many factors to vary the spectral characteristics, such as concentration, temperature, pH, time, etc.

At least as a solution to the disadvantage of the dye-type color filter, the pigment-dispersed color filter layer has been mainly used as of now. However, the colorant which determines the spectral characteristics is in the form of particles, and therefore, the number of black defects is nonnegligibly large as a result of the decrease in pixel size, as to which the pigment-dispersed color filter is inferior to the dye-type color filter.

In view of such, for the purpose of ameliorating a black defect which would occurs due to a pigment-dispersed color filter layer, a so-called "dye-contained type" material has been proposed and practically used in some devices. The dye-contained type material is a material prepared by dispersing a dye in a binder resin and adding a cross-linking agent thereto for providing photosensitivity.

When a dye-contained type color filter layer is used, a black defect can be ameliorated, and in addition, the production process does not require an anti-dyeing step. Thus, the dye-contained type color filter layer can be formed through substantially the same process as that of the pigment-dispersed color filter layer. However, the dye-contained type color filter layer is inferior to the pigment-dispersed color filter layer in readiness to reduce the film thickness and durability (lightfastness, heat resistance, chemical resistance, etc.).

As described above, the significance of the on-chip color filter layer in the solid state imaging devices has been increasing, and establishment of a technique which overcomes various disadvantages, such as color mixture, nonuniform tone of lines, uneven color, black defects, etc., has been demanded. In the conventional solid state imaging devices, dye-type, pigment-dispersed type, and dye-contained type color filter layers are selectively used according to their uses. However, none of these color filter layers overcomes all the disadvantages.

Under such circumstances, the researchers have been studying for eliminating the disadvantages of the above materials. For example, a method for forming a dye-type color filter layer (first color filter layer) and a pigment-dispersed color filter layer (second color filter layer) on the dye-type color filter layer has been recommended. A conventional solid state imaging device 10 having such a layered color filter has been described below.

Figure 6:
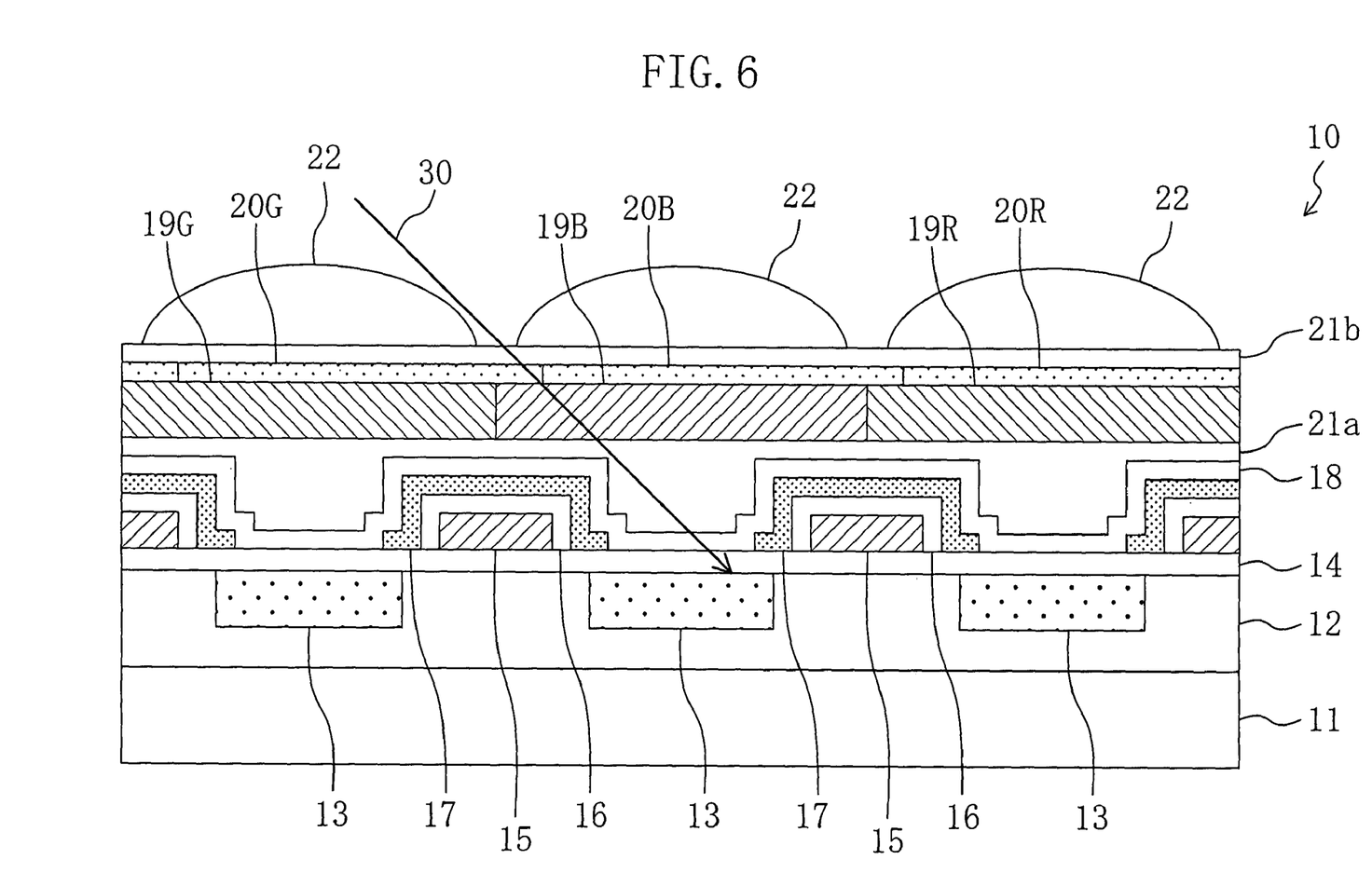
FIG. 6 schematically shows a cross-sectional structure of a conventional solid state imaging device.

FIG. 6 is a cross-sectional view of the conventional solid state imaging device 10, which schematically shows a structure of photoelectric conversion elements and their peripheral elements.

The conventional solid state imaging device 10 is formed using, for example, an N-type semiconductor substrate 11. On the N-type semiconductor substrate 11 is a P-type well layer 12. On the P-type well layer 12 are a plurality of photoelectric conversion elements 13, which constitute an N-type semiconductor layer.

The conventional solid state imaging device 10 includes a gate dielectric film 14, which covers the P-type well layer 12 and the photoelectric conversion elements 13, and transfer electrodes 15 formed on the gate dielectric film 14 for transferring signals. The transfer electrodes 15 are provided above the interval areas between the photoelectric conversion elements 13.

The conventional solid state imaging device 10 further includes an interlayer dielectric film 16, which covers the transfer electrodes 15, and a light shielding film 17 which covers the interlayer dielectric film 16 and prevents light from reaching the transfer electrodes 15.

The conventional solid state imaging device 10 further includes a surface protection film 18, which covers the gate dielectric film 14 and the light shielding film 17, and a first transparent flattening film 21a which compensates for the convexities/concavities generated by the transfer electrodes 15.

On the first transparent flattening film 21a is a first color filter layer 19. The first color filter layer 19 has predetermined colors for respective pixels. For example, the first color filter layer 19 includes first green filter segments 19G, first blue filter segments 19B, and first red filter segments 19R.

On the first color filter layer 19 is a second color filter layer 20. The second color filter layer 20 also has predetermined colors for respective pixels. For example, the second color filter layer 20 includes second green filter segments 20G, second blue filter segments 20B, and second red filter segments 20R. In each pixel, the first color filter layer 19 and the second color filter layer 20 have filter segments of the same color.

On the second color filter layer 20 is a second transparent flattening film 21b which provides a flat surface over the structure. On the second transparent flattening film 21b are on-chip microlenses 22 provided for improving the light-collection efficiency. The microlenses 22 correspond to the pixels on a one-to-one basis.

In the solid state imaging device 10, the first color filter layer 19 is a dye-type color filter layer, and the second color filter layer 20 is a pigment-dispersed color filter layer. With such a structure, the disadvantages of the dye-type color filter layer in heat resistance, lightfastness and chemical resistance are eliminated by the pigment-dispersed color filter layer superposed thereon.

Such a layered color filter is disclosed in, for example, Japanese Laid-Open Patent Publication No. 5-119211.

However, the above-described conventional technique has other disadvantages as described below.

In the production process of the solid state imaging device 10, the first color filter layer 19, which is a dye-type color filter layer, is formed through application of a dye-type material, pattern formation by exposure and development, and dyeing and anti-dyeing steps. The second color filter layer 20, which is a pigment-dispersed color filter layer, is formed through application of a pigment-dispersed material on the first color filter layer 19 and pattern formation by exposure and development.

That is, the steps of application, exposure and development are performed twice (i.e., performed separately on two color filter layers). Herein, different developer solutions are used for the first color filter layer 19 and the second color filter layer 20. Specifically, the developer solution for the dye-type color filter layer is pure water, while the developer solution for the pigment-dispersed color filter layer is an organic alkaline solution.

Since the exposure step is performed twice, the possibility of mask misalignment is increased. Accordingly, it is difficult to perform pattern formation with a precision desired for the color filter. That is, misalignment is likely to occur between the two color filter layers. As a result, the problems of uneven color, nonuniform tone of lines, color mixture between adjacent pixels, etc., are not sufficiently overcome.

In the solid state imaging device 10 shown in FIG. 6, color boundaries are misaligned between the first color filter layer 19 and the second color filter layer 20. For example, the boundary between the first green filter segment 19G and the first blue filter segment 19B is not coincident with the boundary between the second green filter segments 20G and the second blue filter segments 20B.

Thus, for example, light 30 diagonally incident on the solid state imaging device 10, which is indicated by an arrow, passes through filter segments of different colors (the second green filter segments 20G and the first blue filter segment 19B) before reaching the photoelectric conversion element 13.

Further, conventionally, to compensate for insufficient adhesion between a surface protection film and a color filter layer, a transparent flattening film is provided between the surface protection film and the color filter layer. Accordingly, the total thickness of the layers formed on the photoelectric conversion element increases (the distance between the photoelectric conversion element and the microlens increases). Thus, color mixture due to diagonal incident light increases, and the incident angle dependence deteriorates.

SUMMARY OF THE INVENTION

In view of the above problems, an objective of the present invention is to provide a solid state imaging device which has a color filter including at least two color filter layers with no pattern misalignment but with excellent spectral characteristics and durability, wherein color mixture between adjacent pixels, nonuniform tone of lines, uneven color, etc., are eliminated. Another objective of the present invention is to provide a method for stably producing such a solid state imaging device.

In order to achieve the above objectives, a solid state imaging device of the present invention comprises a plurality of pixels arranged in a matrix, each of the pixels including: a substrate; a photoelectric conversion element for converting light to electric charges; and a color filter formed on the photoelectric conversion element for color separation, wherein the color filter is a layered color filter including a dye-contained color filter layer and a pigment-dispersed color filter layer formed on the dye-contained color filter layer, the dye-contained color filter layer and the pigment-dispersed color filter layer having the same hue.

According to the solid state imaging device of the present invention, the color filter includes the dye-contained color filter layer, which is superior in spectral characteristics but inferior in durability, such as heat resistance, lightfastness, chemical resistance, etc., and the pigment-dispersed color filter layer, which has excellent durability, on the dye-contained color filter layer. Thus, the solid state imaging device of the present invention includes the layered color filter which is excellent in both spectral characteristics and durability, thereby achieving high reliability. The solid state imaging device of the present invention has high flexibility as to the spectral characteristics because the two types of color filter layers are superposed. It is most desired that the dye-contained color filter layer and the pigment-dispersed color filter layer have the same hue, but the color filter is usable so long as these color filter layers have similar hues.

The dye-contained color filter layer has strong adhesion to the photoelectric conversion element as compared with the pigment-dispersed color filter layer. Therefore, a transparent flattening film, which would be indispensable in the case of the pigment-dispersed color filter layer, can be omitted. As a result, the thickness of the structure formed on the photoelectric conversion element can be reduced. Accordingly, the photosensitivity and the incident angle dependence can be improved.

For example, the pigment-dispersed color filter layer has a structure where a pigment is dispersed in a binder resin to about the same amount as that of the binder resin. Generally, the pigment is not adhesive. Thus, the area in which the binder resin, which is adhesive, comes in contact with the photoelectric conversion element is decreased, and the pigment-dispersed color filter layer has poorer adhesion than the dye-contained color filter layer has. In the case of the dye-contained color filter layer, adhesion is secured because a dye is dissolved in the binder resin that is adhesive.

The dye-contained color filter layer and the pigment-dispersed color filter layer have coincidental planer shapes and superposed with no displacement therebetween. Thus, the layered color filter has high dimensional accuracy and is insusceptible to the influence of the color filter layers of adjoining pixels even in the case of diagonally-incident light. Therefore, color mixture is suppressed, and uneven color and nonuniform tone of lines are ameliorated as compared with conventional ones.

Preferably, the thickness of the dye-contained color filter layer is larger than that of the pigment-dispersed color filter layer.

With the above structure, the dye-contained color filter layer, which is excellent in spectral characteristics, mainly functions for color separation. The pigment-dispersed color filter layer, which is excellent in durability, is formed on the dye-contained color filter layer, so that the durability of the layered color filter is improved.

Preferably, the refractive index of the dye-contained color filter layer is smaller than that of the pigment-dispersed color filter layer.

With the above structure, the refractive index of the lower layer of the layered color filter (dye-contained color filter layer) is smaller than that of the upper layer (pigment-dispersed color filter layer). As a result, when passing through the interface between the upper layer and the lower layer, incident light is refracted in a direction such that the incident angle with respect to the photoelectric conversion element increases. Thus, light can be collected from a position distant from the center of the photoelectric conversion element, and the amount of light that reaches the photoelectric conversion element increases. Therefore, the photosensitivity of the solid state imaging device improves.

Preferably, the solid state imaging device further comprises a charge transfer portion on the substrate for transferring the electric charges generated by the photoelectric conversion element. The charge transfer portion forms a concavity above the photoelectric conversion element, and the concavity is filled with the layered color filter.

With the above structure, the thickness of the structure formed on the photoelectric conversion element is small as compared with a case where a transparent flattening film is formed so as to cover the charge transfer portion and the photoelectric conversion element and the color filter layer is formed on the transparent flattening film. Thus, improvement of the photosensitivity and amelioration of the incident angle dependence are possible. Further, since the layered color filter is formed to fill the concavity, the color filter layer corresponding to each photoelectric conversion element can readily be formed with high dimensional accuracy.

Preferably, the solid state imaging device further comprises a transparent film on the layered color filter for flattening, wherein the refractive index of the transparent film is smaller than that of the layered color filter.

With the above structure, an irregular surface of the layered color filter can be flattened. Thus, microlenses can be formed over the transparent film with improved accuracy. Further, since the refractive index of the transparent film is smaller than that of the layered color filter, incident light is refracted when passing through the interface between the upper layer and the lower layer in a direction such that the incident angle with respect to the photoelectric conversion element decreases. As a result, the route of light passing through the layered color filter is shortened, and the amount of light absorbed by the layered color filter is decreased. Thus, the amount of light which reaches the photoelectric conversion element is increased.

Preferably, the solid state imaging device further comprises a microlens on the transparent film, wherein the refractive index of the microlens is larger than that of the transparent film.

With the above structure, light is collected by the microlens, the amount of light that reaches the photoelectric conversion element is increased, and the photosensitivity is improved. This effect is further improved when the refractive index of the microlens is larger than that of the transparent film. That is, since incident light is refracted when passing through the interface between the microlens and the transparent film in a direction such that the incident angle of light with respect to the photoelectric conversion element increases, light can be collected from a position distant from the center of the photoelectric conversion element.

A pigment-dispersed color filter layer which contains a pigment in the form of particles is formed on a dye-contained color filter layer which does not contain a pigment in the form of particles, and microlenses are formed on the dye-contained color filter layer. The distance between the pigment-dispersed color filter layer and the microlenses is decreased, whereby the diameter of a spot of light which passes through the pigment-dispersed color filter layer is increased. As a result, interruption of light by the pigment particles contained in the pigment-dispersed color filter layer is reduced. Thus, black defects are reduced.

In order to achieve the above objectives, a solid state imaging device production method of the present invention comprises the steps of: forming on a substrate a photoelectric conversion element for converting light to electric charges; and forming on the photoelectric conversion element a layered color filter for color separation, wherein the step of forming the layered color filter includes forming a first material film of a dye-contained material, forming a second material film of a pigment-dispersed material on the first material film, and performing exposure simultaneously on the first material film and the second material film before developing the first material film and the second material film.

According to the solid state imaging device production method, in fabrication of a layered color filter, a dye-contained material film is first formed, and a pigment-dispersed material film is formed over the dye-contained material film. Thereafter, the two layers of films are simultaneously exposed to light and then developed. Thus, the dye-contained color filter layer and the pigment-dispersed color filter layer of the layered color filter can be formed while avoiding positional displacement.

If a dye-contained color filter layer and a pigment-dispersed color filter layer are separately formed at different film formation, exposure and development steps as in conventional methods, a positional displacement is likely to occur due to mask misalignment, or the like. However, according to the method of the present invention, a pattern is formed through a cycle of exposure and development steps, and therefore, such a displacement does not occur.

Herein, the development process can be performed on the dye-contained material film (first material film) and the pigment-dispersed material film (second material film) with different conditions. For example, in view of different development speeds for the first and second material films, development is first performed with a developer solution of a faster development speed, and development is then performed with a developer solution of a slower development speed. Alternatively, the same developer solution may be used for the first and second material films, but the first material film is developed at room temperature whereas the second material film is developed at a high temperature. In such a case, for example, a required number of nozzles for supplying developer solutions are provided such that it is not necessary to increase the number of process steps.

Preferably, the production method further comprises, after the step of forming the photoelectric conversion element and prior to the step of forming the layered color filter, the step of forming on the substrate a charge transfer portion for transferring the electric charges generated by the photoelectric conversion element, wherein the charge transfer portion forms a concavity above the photoelectric conversion element, and the step of forming the layered color filter includes forming the layered color filter to fill the concavity.

With the above method, over the substrate, concavities are formed by the charge transfer portions above photoelectric conversion portions. Then, the layered color filter is formed to fill the concavities. Thus, the layered color filter can readily be formed above the photoelectric conversion elements with high accuracy.

Preferably, the production method further comprises the step of forming on the layered color filter a microlens for collecting light.

With the above method, a solid state imaging device of the present invention with high light collection efficiency can be produced because of the microlens for light collection.

As described above, a solid state imaging device of the present invention has a layered color filter which includes a dye-contained color filter layer and a pigment-dispersed color filter layer which is formed on the dye-contained color filter layer and has the same hue as that of the dye-contained color filter layer. In this structure, the pigment-dispersed color filter layer which is superior in durability is formed on the dye-contained color filter layer which is superior in spectral characteristics but inferior in durability. Therefore, the solid state imaging device has the color filter which is excellent in both spectral characteristics and durability. Further, the two layers of films are formed without a displacement therebetween. Therefore, mixture of colors due to diagonally incident light is prevented, nonuniform tone of lines is ameliorated, and uneven color is reduced. Furthermore, the microlens is formed such that the distance between the microlens and the pigment-dispersed color filter layer is short. Thus, the black defects can be reduced.

According to the solid state imaging device production method of the present invention, the dye-contained color filter layer and the pigment-dispersed color filter layer are exposed to light at one exposure step and then developed. Therefore, these layers can be formed with high dimensional accuracy without occurrence of mask misalignment. With this method, a solid state imaging device of the present invention can be produced. This solid state imaging device has a color filter in which a pigment-dispersed color filter layer is formed on a dye-contained color filter layer with high dimensional accuracy and is therefore useful as a solid state imaging device which has small-sized pixels.

DESCRIPTION OF THE PREFERRED EMBODIMENTS

Hereinafter, a solid state imaging device of the present invention and a production method thereof are described.

Figure 1:
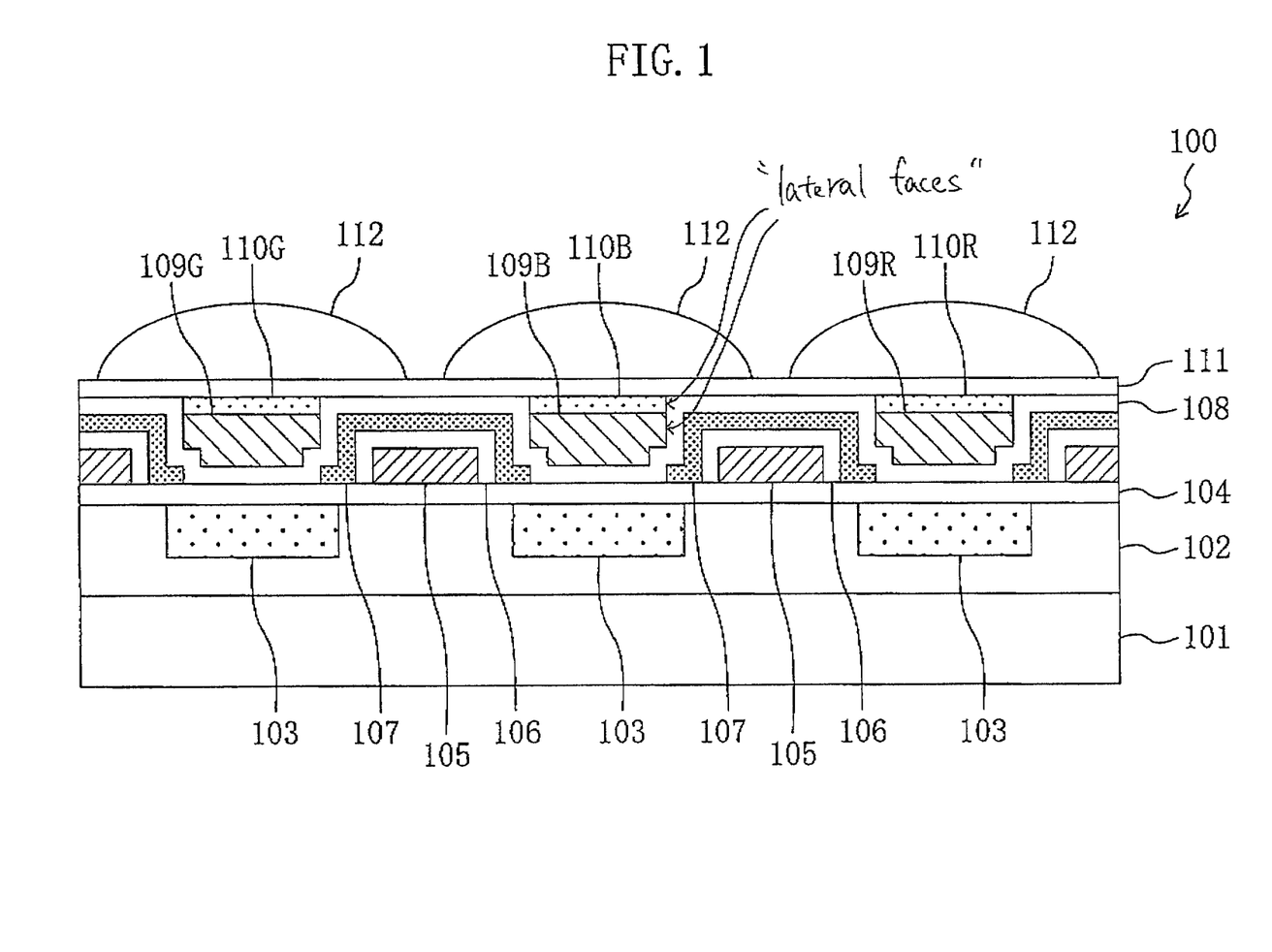
FIG. 1 schematically shows a cross-sectional structure of a solid state imaging device according to an embodiment of the present invention.

FIG. 1 schematically shows a cross-sectional structure of a solid state imaging device according to an embodiment of the present invention. FIG. 1 shows an area of three photoelectric conversion elements.

As shown in FIG. 1, the solid state imaging device 100 of the present invention is herein formed using an N-type semiconductor substrate 101 (semiconductor substrate of the first conductivity type). The solid state imaging device 100 includes a P-type well 102 (second conductivity type well) on the N-type semiconductor substrate 101 and a plurality of photoelectric conversion elements 103 (N-type semiconductor regions) on the P-type well 102. It should be noted that, although not shown, the photoelectric conversion elements 103 are arranged in a matrix over the N-type semiconductor substrate 101. According to the present invention, on the contrary, the first conductivity type may be P-type, and the second conductivity type may be N-type.

The solid state imaging device 100 further includes a gate dielectric film 104, which covers the P-type well 102 and the photoelectric conversion elements 103, and transfer electrodes 105 formed on the gate dielectric film 104. The transfer electrodes 105 are provided above the interval areas between the photoelectric conversion elements 103. The transfer electrodes 105 are formed of, for example, polycrystalline silicon, but the present invention is not limited thereto.

The solid state imaging device 100 further includes an interlayer dielectric film 106, which covers the transfer electrodes 105, and a light shielding film 107 which covers the interlayer dielectric film 106. The solid state imaging device 100 further includes a surface protection film 108 that covers the photoelectric conversion elements 103 and the light shielding film 107. Herein, the light shielding film 107 is formed of, for example, tungsten. The surface protection film 108 is formed of, for example, SiON.

The transfer electrodes 105, the interlayer dielectric film 106, and the light shielding film 107 have over the gate dielectric film 104 a planar structure which surrounds the photoelectric conversion elements 103. As a result, concavities are formed above the photoelectric conversion elements 103. Above the photoelectric conversion elements 103, a dye-contained color filter layer 109 is formed to fill the concavities, so that the gate dielectric film 104 exists between the photoelectric conversion elements 103 and the dye-contained color filter layer 109. On the dye-contained color filter layer 109 is a pigment-dispersed color filter layer 110. The dye-contained color filter layer 109 and the pigment-dispersed color filter layer 110 constitute a layered color filter of a two-layer structure.

The dye-contained color filter layer 109 includes green dye-contained filter segments 109G, blue dye-contained filter segments 109B, and red dye-contained filter segments 109R. Each of the photoelectric conversion elements 103 corresponds to a dye-contained filter segment of a predetermined color.

The pigment-dispersed color filter layer 110 includes green pigment-dispersed filter segments 110G, blue pigment-dispersed filter segments 110B, and red pigment-dispersed filter segments 110R. Each of the pigment-dispersed filter segments corresponds to a dye-contained filter segment of the same color in the underlying dye-contained color filter layer 109.

A transparent flattening film 111 is provided to cover the surface protection film 108 and the pigment-dispersed color filter layer 110, thereby providing a flat surface over the structure. On the transparent flattening film 111 are on-chip microlenses 112 provided for improving the light-collection efficiency. The microlenses 112 correspond to the photoelectric conversion elements 103 on a one-to-one basis.

As described above, in the solid state imaging device 100, the layered color filter includes the dye-contained color filter layer 109 and the pigment-dispersed color filter layer 110 formed thereon. Thus, the layered color filter possesses the advantages of the dye-contained color filter layer. That is, since the dye-contained color filter layer has excellent spectral characteristics and the contained dye is not in the form of particles, a smaller number of black defects occur in this layer. At the same time, the disadvantages of the dye-contained color filter layer, i.e., inferiority in durability (e.g., lightfastness, heat resistance, chemical resistance), are ameliorated by the pigment-dispersed color filter layer which has excellent durability.

Since the pigment-dispersed color filter layer 110 is closer to the microlenses 112 than the dye-contained color filter layer 109 is, the diameter of a spot of light collected by the microlenses 112 is relatively large in the pigment-dispersed color filter layer 110, whereas the diameter of a spot of light collected by the microlenses 112 is relatively small in the dye-contained color filter layer 109. As a result, the disadvantages of the pigment-dispersed color filter layer, i.e., the black defects, are decreased.

Since the dye-contained color filter layer 109 formed on the surface protection film 108 has stronger adhesion to the surface protection film than the pigment-dispersed color filter layer has, a transparent flattening film which would be required to be provided over the surface protection film 108 is unnecessary. Thus, in the solid state imaging device 100, it is possible to form the color filter layer above the photoelectric conversion elements 103 without a transparent flattening film therebetween.

As a result, the distance between the photoelectric conversion elements 103 and the microlenses 112 is shortened. In other words, the thickness of the structure between the photoelectric conversion elements 103 and the microlenses 112 is decreased.

As described above, the color filter layer is buried in the concavities formed on the photoelectric conversion elements 103 by the transfer electrodes 105. Thus, the color filter layer can be readily formed with high dimensional accuracy.

With the above, the photosensitivity is improved, mixture of colors between adjacent pixels due to diagonally incident light is prevented, a sensitivity variation, nonuniform tone of lines, and uneven color are ameliorated. Further, the incident angle dependence is ameliorated.

In the case where the dye-contained color filter layer 109 has (i.e., is formed of a material having) a refractive index smaller than that of the pigment-dispersed color filter layer 110, the light-collection efficiency is improved. In the case where the refractive index of the transparent flattening film 111 is smaller than that of the pigment-dispersed color filter layer 110, the amount of light introduced to the photoelectric conversion elements 103 is increased. The light-collection efficiency is also increased by making the refractive index of the microlenses 112 larger than that of the transparent flattening film 111. These structures are described with reference to FIG. 2.

Figure 2:
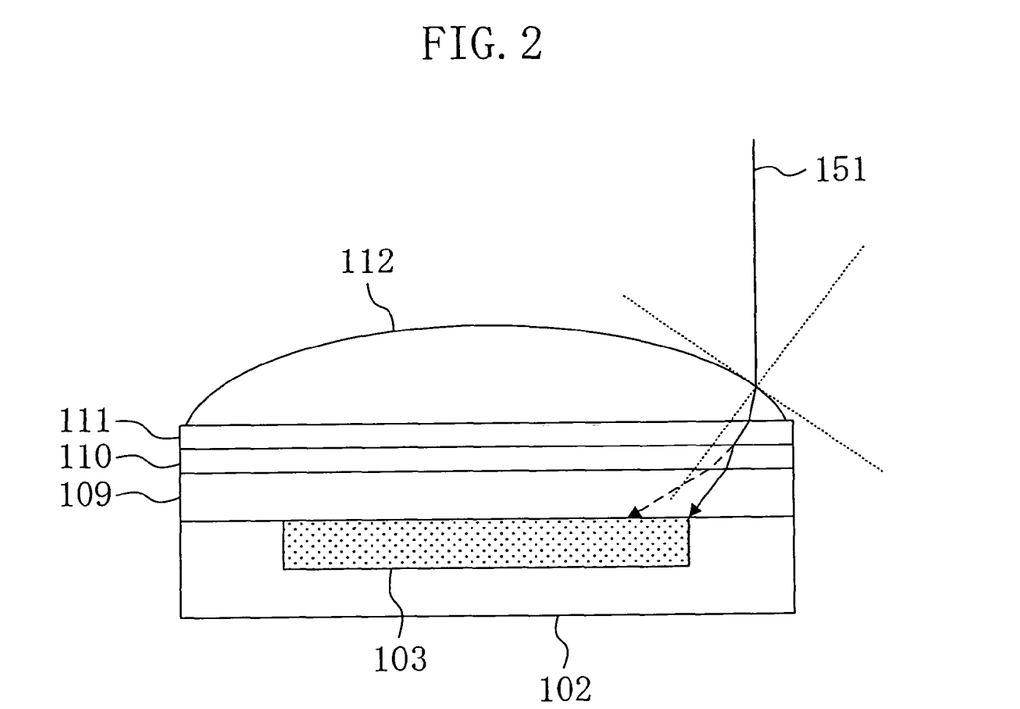
FIG. 2 illustrates the increase in collected light amount with a certain relationship between the refractive indices of components in the solid state imaging device according to the embodiment of the present invention.

FIG. 2 shows a route of light 151 incident on the microlens 112 of the solid state imaging device 100 at a position near its peripheral edge (outer position than the photoelectric conversion element 103).

First, consider a case where the microlens 112, the transparent flattening film 111, the pigment-dispersed color filter layer 110 and the dye-contained color filter layer 109 have the above-described relationship as to the refractive index. In this case, the incident light 151 passes through the route indicated by a solid line to reach the photoelectric conversion element 103.

Firstly, the incident light 151 is refracted by the microlens 112 toward the center of the photoelectric conversion element 103. Then, the light 151 is further refracted at the interface between the microlens 112 and the transparent flattening film 111 toward the center of the photoelectric conversion element 103 because the microlens 112 has a larger refractive index than that of the transparent flattening film 111. As well, the incident light is refracted at the interface between the pigment-dispersed color filter layer 110 and the dye-contained color filter layer 109 toward the center of the photoelectric conversion element 103 because the pigment-dispersed color filter layer 110 has a larger refractive index than that of the dye-contained color filter layer 109. Both structures enable collection of light from a position distant from the photoelectric conversion element 103 and contribute to improvement of the light collection efficiency. Herein, if these relationships as to the refractive index are inverse, the light 151 would be refracted in a direction leaving from the photoelectric conversion element 103. Therefore, the light collection efficiency would be decreased.

Since the transparent flattening film 111 has a smaller refractive index than that of the pigment-dispersed color filter layer 110, the light 151 is refracted at the interface between the transparent flattening film 111 and the pigment-dispersed color filter layer 110 in a direction such that the incident angle of the light 151 with respect to the photoelectric conversion element 103 is smaller. As a result, the route of light passing through the layered color filter (the pigment-dispersed color filter layer 110 and the dye-contained color filter layer 109) is shortened. Accordingly, the amount of light absorbed by the layered color filter is decreased. As a result, the amount of light which reaches the photoelectric conversion element 103 is increased. This route is shown by a solid line in FIG. 2.

The contrary case where the transparent flattening film 111 has a larger refractive index than that of the pigment-dispersed color filter layer 110 (while the other aspects are the same as those of this embodiment) is shown by a broken line in FIG. 2. In this case, the light is also refracted at the interface between the transparent flattening film 111 and the pigment-dispersed color filter layer 110 toward the center of the photoelectric conversion element 103. This route is excellent in collecting the light incident on the microlens 112 at a position near its peripheral edge so as to reach the photoelectric conversion element 103. However, the route of light in the layered color filter is longer than in this embodiment. Therefore, the amount of light absorbed by the layered color filter is increased. As a result, the amount of collected light is smaller than that of this embodiment.

As described above, in the case where the microlens 112 and underlying layers have the above-described relationships as to the refractive index as described in this embodiment, light incident on the microlens 112 at a position near its peripheral edge can be collected, and at the same time, the amount of light absorbed by the layered color filter is decreased. As a result, the amount of collected light introduced to the photoelectric conversion element 103 is increased in total.

Thus, the solid state imaging device 100 of this embodiment enables imaging of pictures with high quality.

Next, a method for producing the solid state imaging device 100 according to this embodiment is described with reference to the drawings. First, a method for forming a dye-contained color filter layer and a pigment-dispersed color filter layer with no misalignment therebetween is described.

Figure 3A:
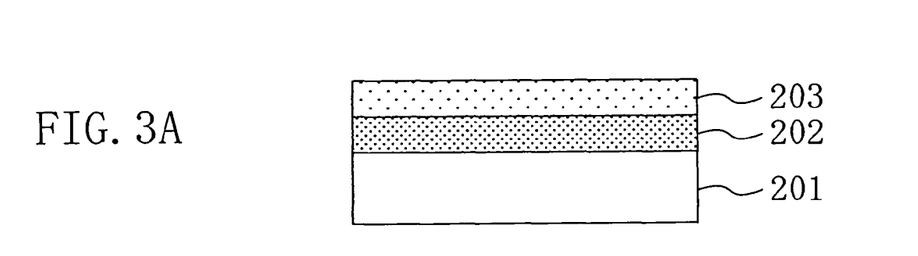
FIG. 3A, FIG. 3B and FIG. 3C illustrate a method for forming a layered color filter in a production process of a solid state imaging device according to the embodiment of the present invention.
Figure 3B:
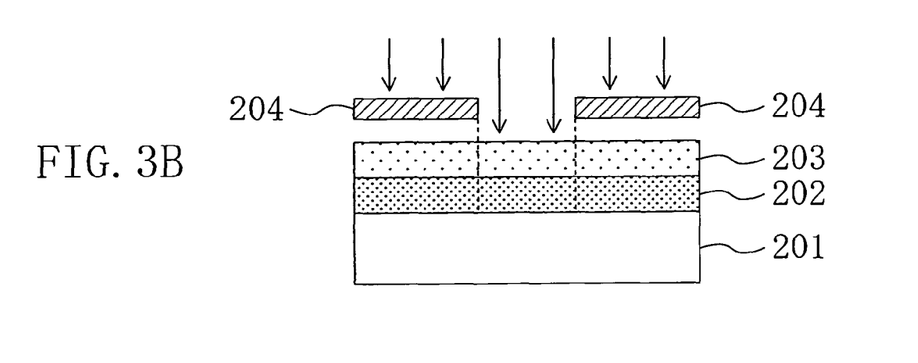
Figure 3C:
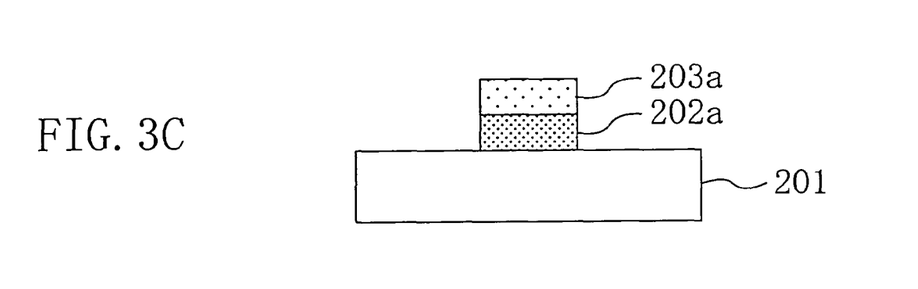

FIG. 3 illustrates a method for forming a layered color filter in the production process of the solid state imaging device of the present invention.

Referring to FIG. 3A, at the first step, a first photosensitive material film 202 is formed on a layered structure 201, and then, a second photosensitive material film 203 is formed on the first photosensitive material film 202. It should be noted that the first photosensitive material film 202 may be a dye-contained color filter layer, and the second photosensitive material film 203 may be a pigment-dispersed color filter layer. Although not specifically shown, the layered structure 201 may be a structure including photoelectric conversion elements and other components which are formed on a substrate for forming a solid state imaging device.

Referring to FIG. 3B, the resultant structure is then exposed to light using a mask 204. If both the first photosensitive material film 202 and the second photosensitive material film 203 are negative-type photosensitive materials, only the exposed portions become insoluble. The resultant structure undergoes a development process, such that a first pattern 202a and a second pattern 203a are formed as shown in FIG. 3C.

According to a conventional technique, a first photosensitive material film 202 is formed and subjected to exposure and development to form a first pattern 202a, and then, a second photosensitive material film 203 is formed and subjected to exposure and development to form a second pattern 203a. Thus, misalignment which occurs through a twice-performed mask alignment step causes displacement in dimensions (position, size, etc.) between the first pattern 202a and the second pattern 203a.

According to the method of the present invention, the layered first photosensitive material film 202 and second photosensitive material film 203 are exposed to light at the same time and developed in succession. Thus, the first pattern 202a and the second pattern 203a can be formed with high dimensional accuracy without causing a displacement.

The above-described method is not limited to formation of color filter layers but applicable to formation of a layered structure consisting of two or more photosensitive material layers. The layered structure 201 is not limited to any particular structure but may be a simple semiconductor substrate.

In the development step, the first photosensitive material film 202 and the second photosensitive material film 203 may be subjected to development in succession on a one-layer by one-layer basis under different conditions. For example, development is performed on the second photosensitive material film 203 using a first developer solution which is effective only for the second photosensitive material film 203, and then, development is performed on the first photosensitive material film 202 using a second developer solution which is effective only for the first photosensitive material film 202. In this process, an increase in the number of steps can be prevented by providing a development device with a plurality of developer solution supplying nozzles.

Next, a method for producing the solid state imaging device 100 is described with reference to FIG. 4 and FIG. 5 in conjunction with FIG. 1.

Figure 4:
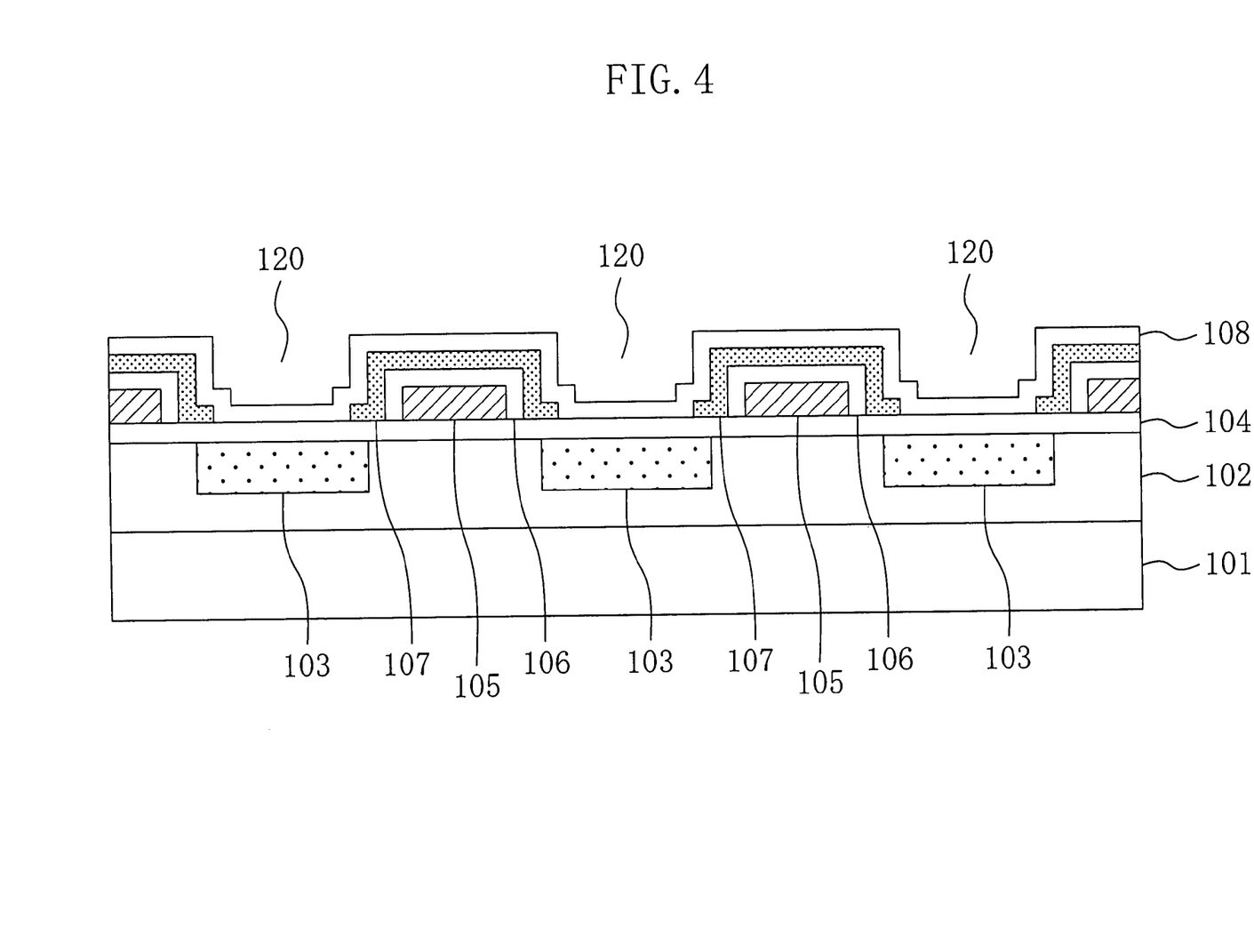
FIG. 4 shows a step in the production process of a solid state imaging device according to the embodiment of the present invention, where a surface protection film 108 and components formed previously are completed.

FIG. 4 shows that the surface protection film 108 and underlying components have been formed in the production process of the solid state imaging device 100 shown in FIG. 1.

To produce the solid state imaging device 100, at the first step, for example, a P-type impurity is introduced to an N-type semiconductor substrate 101 to form a P-type well 102. Then, for example, an N-type impurity is introduced to the surface of the P-type well 102 to form photoelectric conversion elements (N-type semiconductor layer) 103 in a matrix configuration.

Subsequently, a gate dielectric film 104 is formed so as to cover the P-type well 102 and the photoelectric conversion elements 103. Then, conductive polycrystalline silicon is patterned over the gate dielectric film 104 to form transfer electrodes 105. Then, an interlayer dielectric film 106 is formed so as to cover the transfer electrodes 105 such that the transfer electrodes 105 are electrically insulated, and a light shielding film 107 is formed of tungsten, or the like, so as to cover the interlayer dielectric film 106.

Subsequently, a surface protection film 108 is formed using, for example, BPSG (boron phosphosilicate glass), SiON, or the like, through a thermal flow process so as to cover the surfaces of the gate dielectric film 104 and the light shielding film 107.

In this example, over the gate dielectric film 104, the transfer electrodes 105 have a planer shape that surrounds the photoelectric conversion elements 103. Therefore, in the state of FIG. 4 where the interlayer dielectric film 106, the light shielding film 107 and the surface protection film 108 have been formed, concavities (holes) 120 surrounded by the transfer electrodes 105 exist above the photoelectric conversion elements 103.

Thereafter, wires are formed of an aluminum alloy, or the like, and a SiON film, a bonding pad for electrodes, etc., are formed, although none of these elements is shown.

Figure 5:
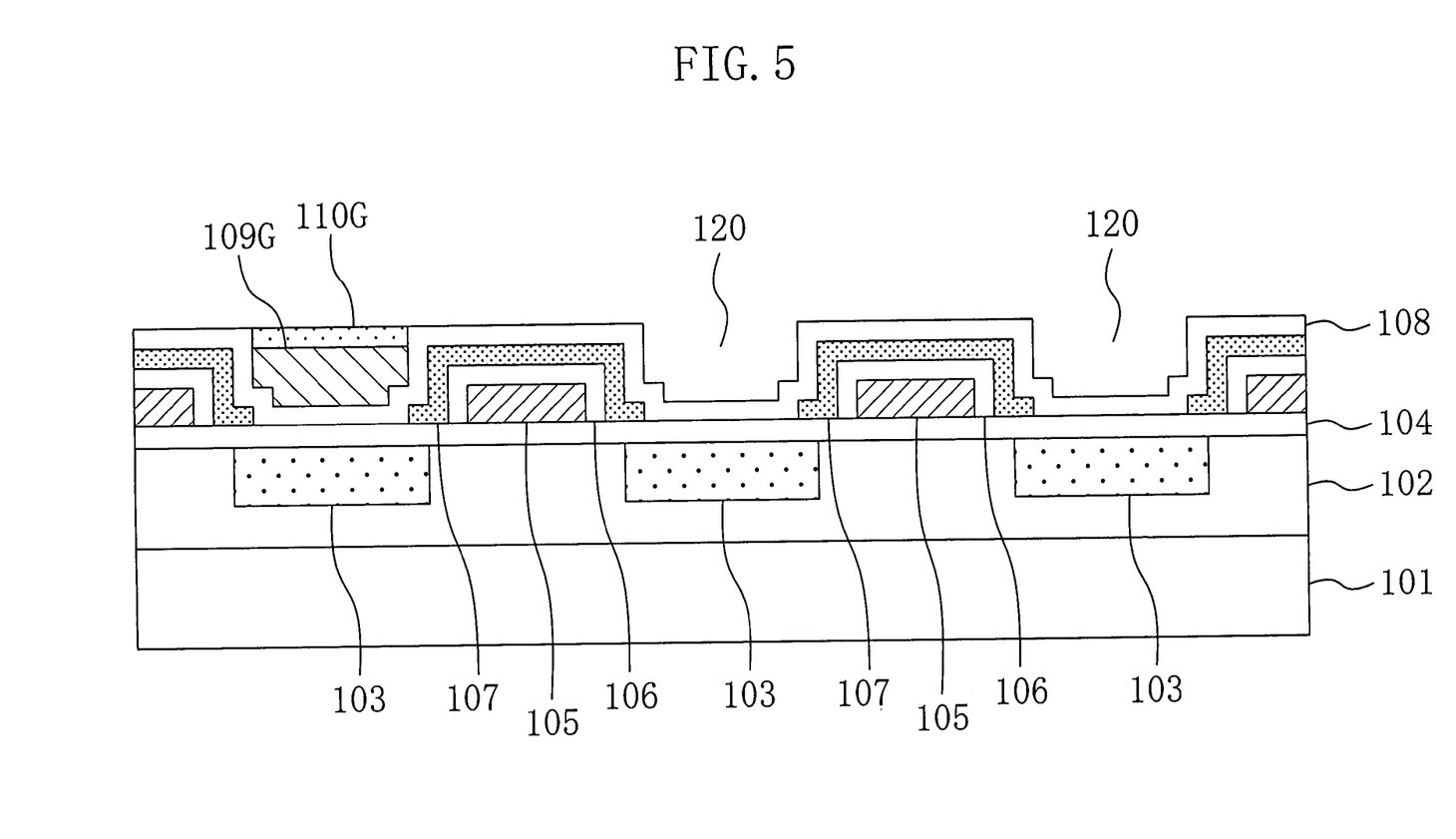
FIG. 5 shows a step in the production process of a solid state imaging device according to the embodiment of the present invention, where a first color filter layer, including a green dye-contained type filter segment 109G and a green pigment-dispersed filter segment 110G, and components formed previously are completed.

FIG. 5 shows that a two-layer color filter has been formed for one color. Specifically, FIG. 5 shows that a layered film of a green dye-contained filter segment 109G and a green pigment-dispersed filter segment 110G has been buried in one of the concavities 120 of FIG. 4. Hereinafter, a step of forming this structure is described.

First, to strengthen adhesion between the layered color filter and the underlying surface protection film 108, HMDS (hexamethyldisilazane) is vapor-applied to form a film on parts of the surface protection film 108 which correspond to the bottom and side wall of the concavity 120. It should be noted that this HMDS film may be omitted so long as sufficient adhesion is secured between the surface protection film 108 and the dye-contained color filter layer 109.

Then, a material of the green dye-contained filter segment 109G (dye-contained color resist) is applied, and a material of a green pigment-dispersed filter segment 110G (pigment-dispersed color resist) is applied. As a result, a two-layer structure of a dye-contained color filter material and a pigment-dispersed color filter material is obtained.

Then, the dye-contained color resist film and the pigment-dispersed color resist film are exposed to light at the same time using a mask designed such that color filter layers are formed in predetermined portions. Then, a development process, including post-baking (thermal treatment), is performed, such that a layered color filter of the green dye-contained filter segments 109G and the green pigment-dispersed filter segments 110G is formed at predetermined positions.

It should be noted that the two color filter layers, i.e., the green dye-contained filter segments 109G and the green pigment-dispersed filter segments 110G, desirably have the same hue. However, these filter layers may have different hues so long as their spectral characteristics are similar.

Blue and red layered color filters are also formed in the predetermined concavities 120 that exist above the photoelectric conversion elements 103 in the same way as described above for the green layered color filter. As for the blue layered color filter, a film of a blue dye-contained material for a blue dye-contained filter segment 109B and a film of a blue pigment-dispersed material for a blue pigment-dispersed filter segment 110B are formed into a layered structure. These layered films are exposed to light at the same time using a predetermined mask. The resultant structure is subjected to development and post-baking, such that a blue layered color filter is formed at predetermined positions. The same applies to the red layered color filter.

In this embodiment, the layered color filters are formed in the order of green, blue and red, but the present invention is not limited to this order.

After the layered color filters have been formed for all of the necessary colors, a transparent flattening film 111 is formed. At this step, for example, a thermosetting transparent resin mainly containing an acrylic resin is applied onto parts of the surface protection film 108 which are above the pigment-dispersed color filter layer 110 and the transfer electrodes 105. The resultant structure is subjected to post-baking to complete the transparent flattening film 111. Such application of the thermosetting transparent resin and post-baking are performed several times such that the surface of the structure obtained after the formation of the pigment-dispersed color filter layer 110 is flattened.

To improve the photosensitivity, the distance between the photoelectric conversion element 103 and the microlens 112 is preferably short. In order to shorten the distance, the formed transparent flattening film 111 is preferably etched back to decrease the thickness thereof as much as possible so long as the flatness of the surface is maintained.

Thereafter, microlenses 112 are formed over the transparent flattening film 111 at positions above the respective photoelectric conversion elements 103. First, a positive-type photosensitive thermosetting transparent resin mainly containing, for example, a phenol resin is applied onto the transparent flattening film 111. Then, the resultant structure is subjected to exposure and development (including bleaching and post-baking) to form upwardly-convex microlenses 112. Herein, "bleaching" means a treatment for improving the transmittance of the microlenses 112 by ultraviolet irradiation.

Alternatively, it is possible that, after the application of the transparent resin, the photosensitive resin is further applied, and the resultant structure is subjected to exposure, development and a thermal-flow process, whereby a microlens pattern which is to be transferred is first formed. Thereafter, microlenses 112 are formed of a transparent resin by a well-known method which uses an anisotropic etching technique.

Herein, the post-baking temperature for the microlenses 112 is preferably 200° C. or lower for the purpose of preventing deterioration in spectral characteristics of the layered color filter (the dye-contained color filter layer 109 and the pigment-dispersed color filter layer 110).

Preferably, the refractive index of the transparent flattening film 111 is smaller than that of the layered color filter. The refractive index of the microlenses 112 is preferably larger than that of the transparent flattening film 111. The refractive index of the dye-contained color filter layer 109 is preferably smaller than that of the pigment-dispersed color filter layer 110. With this structure, the light collection efficiency of light incident on the microlenses 112 for the photoelectric conversion elements 103 is increased.

Through the above process, the solid state imaging device 100 of this embodiment is completed.

As described above, the dye-contained color filter layer 109 and the pigment-dispersed color filter layer 110 are formed at the same time through only one cycle of formation process including exposure, development, etc., so as to fill the concavities 120 that exist above the photoelectric conversion elements 103. Thus, the layered color filter layer is formed with desirable dimensional accuracy without causing a misalignment. As a result, color mixture between adjacent pixels due to diagonally-incident light, uneven color, nonuniform tone of lines (variation in photosensitivity), etc., are ameliorated.

In this embodiment, formation of primary color (RGB) filter layers, which are rather used in solid state imaging devices wherein priority is given to the color tone, has been described, but the present invention is not limited thereto. For example, the present invention is applicable to formation of complementary color filter layers which are rather used in solid state imaging devices wherein priority is given to the definition and sensitivity. In this case, a color filter layer for magenta light, a color filter layer for green light, a color filter layer for yellow light, and a color filter layer for cyan light are arranged in a well-known color configuration.

In this embodiment, the descriptions have been provided with an assumption that the solid state imaging device 100 is a CCD solid state imaging device, but the present invention is not limited thereto. For example, the solid state imaging device 100 may be, for example, an amplifier solid state imaging device of MOS (Metal Oxide Semiconductor) type, or the like. The present invention is applicable to still another type of solid state imaging device.

What is claimed is:

1. A solid state imaging device, comprising:
a plurality of pixels arranged in a matrix, each of the pixels including:
a substrate;
a photoelectric element for converting light to electric charges; and
a color filter formed on the photoelectric element for color separation,
wherein the color filter is a layered color filter including a dye-contained color filter layer and a pigment-dispersed color filter layer formed on the dye-contained color filter layer, and
the refractive index of the dye-contained color filter layer is less than that of the pigment-dispersed color filter layer.

2. A solid state imaging device, comprising:
a plurality of pixels arranged in a matrix, each of the pixels including:
a substrate;
a photoelectric element for converting light to electric charges;
a color filter formed on the photoelectric element for color separation; and
a charge transfer portion for transferring the electric charges generated by the photoelectric element;
wherein the color filter is a layered color filter including a dye-contained color filter layer and a pigment-dispersed color filter layer formed on the dye-contained color filter layer,
the charge transfer portion comprises a concavity formed above the photoelectric element, and
the concavity is filled with the layered color filter.

3. A solid state imaging device, comprising:
a plurality of pixels arranged in a matrix, each of the pixels including:
a substrate;
a photoelectric element for converting light to electric charges;
a color filter formed on the photoelectric element for color separation; and
a transparent film disposed on the color filter for flattening the color filter,
wherein the color filter is a layered color filter including a dye-contained color filter layer and a pigment-dispersed color filter layer formed on the dye-contained color filter layer, and
the refractive index of the transparent film is less than that of the color filter.

4. The solid state imaging device of claim 3, further comprising:
a microlens formed on the transparent film, wherein the refractive index of the microlens is greater than that of the transparent film.

5. A method for producing a solid state imaging device, comprising the steps of:
forming a photoelectric element for converting light to electric charges in a substrate; and
forming a layered color filter for color separation on the photoelectric element,
wherein the step of forming the layered color filter includes:
forming a first material film of a dye-contained material, and
forming a second material film of a pigment-dispersed material on the first material film, and
exposing the first material film and the second material film simultaneously, and
developing the first material film and the second material film.

6. The method of claim 5, further comprising after the step of forming the photoelectric element and prior to the step of forming the layered color filter, the step of:
forming a charge transfer portion on the substrate for transferring the electric charges generated by the photoelectric conversion element, which comprises a concavity above the photoelectric conversion element, and
the concavity is filled with the layered color filter.

7. The method of claim 5, further comprising the step of: forming a microlens for collecting light on the layered color filter.

8. The method of claim 5, wherein the first material film and the second material film have the same hue.

* * * * *